(12) United States Patent
Lin et al.

(10) Patent No.: US 12,381,491 B2
(45) Date of Patent: Aug. 5, 2025

(54) METHOD AND APPARATUS FOR SUPPRESSING GRID VOLTAGE IMBALANCE

(71) Applicant: CONTEMPORARY AMPEREX TECHNOLOGY (HONG KONG) LIMITED, Hong Kong (CN)

(72) Inventors: Guiying Lin, Fujian (CN); Jinfeng Gao, Fujian (CN); Weichen He, Fujian (CN)

(73) Assignee: CONTEMPORARY AMPEREX TECHNOLOGY (HONG KONG) LIMITED, Hong Kong (CN)

(*) Notice: Subject to any disclaimer, the term of this patent is extended or adjusted under 35 U.S.C. 154(b) by 125 days.

(21) Appl. No.: 18/225,164

(22) Filed: Jul. 24, 2023

(65) Prior Publication Data
US 2023/0369987 A1    Nov. 16, 2023

Related U.S. Application Data

(63) Continuation of application No. PCT/CN2021/122374, filed on Sep. 30, 2021.

(51) Int. Cl.
*H02M 7/219* (2006.01)
*H02J 3/26* (2006.01)
*H02M 1/12* (2006.01)
*H02M 1/42* (2007.01)

(52) U.S. Cl.
CPC .............. *H02M 7/219* (2013.01); *H02M 1/12* (2013.01); *H02J 3/26* (2013.01); *H02M 1/4216* (2013.01)

(58) Field of Classification Search
CPC ........ H02M 1/12; H02M 1/123; H02M 1/126; H02M 7/219; H02M 7/217; H02M 7/48
See application file for complete search history.

(56) References Cited

U.S. PATENT DOCUMENTS

2005/0117375 A1* 6/2005 Xu ..................... H02J 9/062
                                                    363/95
2013/0010505 A1* 1/2013 Bo ....................... H02J 3/44
                                                    363/37
(Continued)

FOREIGN PATENT DOCUMENTS

CN    102931671 A     2/2013
CN    104201679 A    12/2014
(Continued)

OTHER PUBLICATIONS

International Search Report and Written Opinion mailed on May 26, 2022, received for PCT Application PCT/CN2021/122374, filed on Sep. 30, 2021, 8 pages including English Translation.

(Continued)

*Primary Examiner* — Gustavo A Rosario-Benitez
(74) *Attorney, Agent, or Firm* — XSENSUS LLP

(57) ABSTRACT

The present application provides a method and apparatus for suppressing grid voltage imbalance. By obtaining a 90° lagged grid voltage through a differential tracker, calculating instantaneous power using the 90° lagged grid voltage, and then calculating a power converter voltage according to the instantaneous power, the suppression of grid voltage imbalance may be achieved.

13 Claims, 4 Drawing Sheets

(56) References Cited

U.S. PATENT DOCUMENTS

| | | | |
|---|---|---|---|
| 2013/0082636 A1* | 4/2013 | Ohori | H02P 21/00 |
| | | | 363/41 |
| 2013/0201733 A1* | 8/2013 | Divan | H02M 5/00 |
| | | | 363/39 |
| 2014/0268957 A1* | 9/2014 | Khajehoddin | H02J 3/1842 |
| | | | 363/95 |
| 2016/0248341 A1* | 8/2016 | Trainer | H02M 1/08 |
| 2016/0282392 A1* | 9/2016 | Lee | H02P 21/36 |
| 2019/0245458 A1 | 8/2019 | Wang et al. | |
| 2021/0021209 A1* | 1/2021 | Brogan | H02J 3/381 |
| 2022/0077688 A1* | 3/2022 | Patarroyo | H02J 3/46 |

FOREIGN PATENT DOCUMENTS

| | | | | |
|---|---|---|---|---|
| CN | 105743367 A | | 7/2016 | |
| CN | 108390571 A | * | 8/2018 | H02J 3/01 |
| CN | 110365230 A | | 10/2019 | |
| CN | 111200287 A | * | 5/2020 | G01R 31/00 |
| CN | 109193760 B | | 1/2021 | |
| CN | 112994104 A | | 6/2021 | |
| JP | H07-99779 A | | 4/1995 | |
| JP | 2000-179446 A | | 6/2000 | |
| WO | 2019/182161 A1 | | 9/2019 | |
| WO | 2020/204010 A1 | | 10/2020 | |

OTHER PUBLICATIONS

Office Action issued on May 7, 2024, in corresponding Japanese patent Application No. 2023-530953, 7 pages.

Extended European Search Report issued Feb. 5, 2024 in European Patent Application 21958955.3.

Y. Zhang, et al., "Table-based Direct Power Control for Three-Phase AC/DC Converters Under Unbalanced Grid Voltages", IEEE Transactions on Power Electronics, vol. 30, No. 12, pp. 7090-7099, Dec. 1, 2015, DOI: 10.1109/TPEL.2014.2387694.

W. Chen, et al., "Stationary frame deadbeat power control of three-phase PWM rectifiers under unbalanced grid voltages", Electric Power Systems Research, vol. 108, pp. 223-233, Dec. 11, 2013, http://dx.doi.org/10.1016/j.epsr.2013.11.008.

Y. Zhang, et al., "Direct Power Control of Pulsewidth Modulated Rectifiers Without DC Voltage Oscillations Under Unbalanced Grid Conditions", IEEE Transactions on Industrial Electronics, vol. 65, No. 10, pp. 7900-7910, Oct. 1, 2018, DOI: 10.1109/TIE.2018.2807421.

* cited by examiner

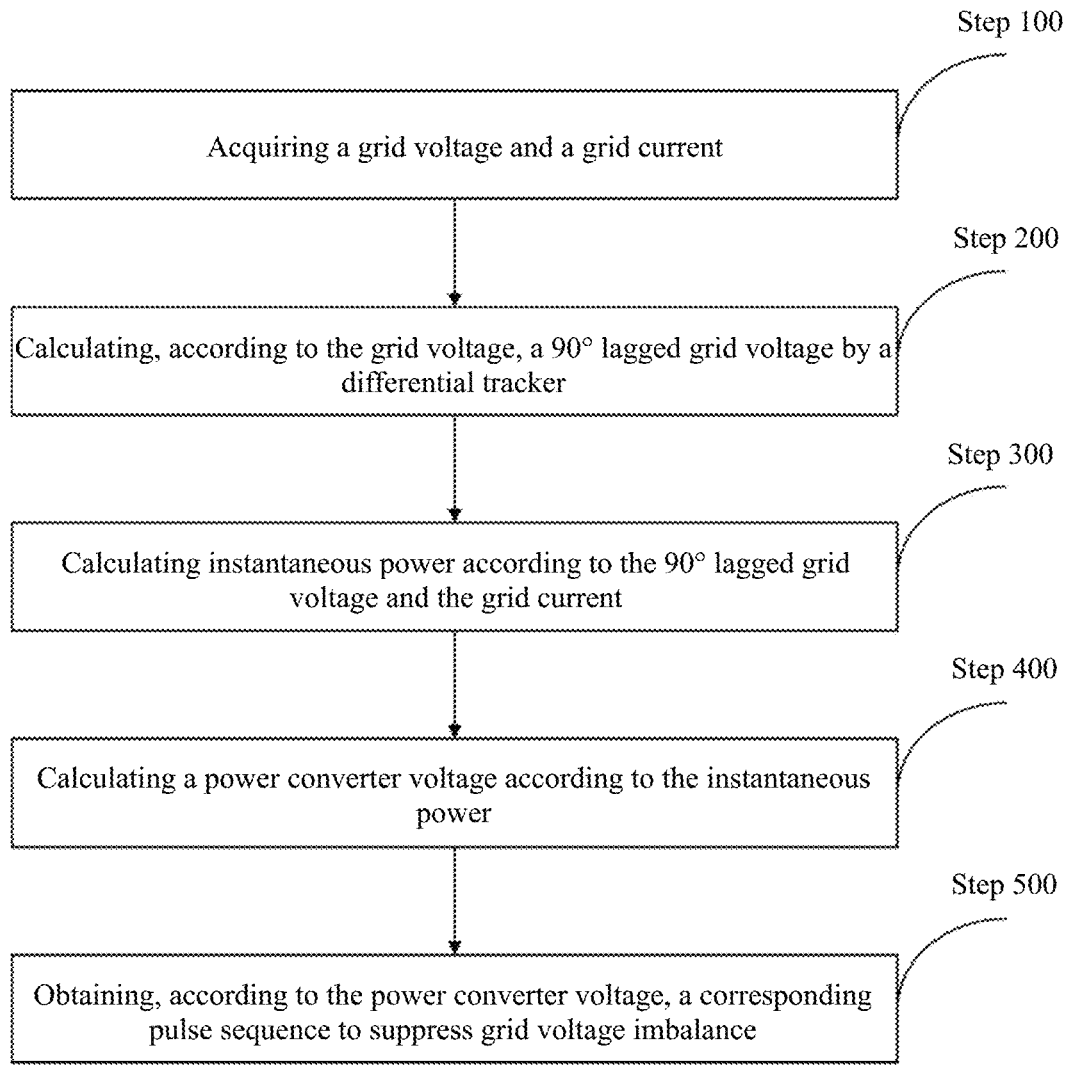

METHOD AND APPARATUS FOR SUPPRESSING GRID VOLTAGE IMBALANCE

CROSS-REFERENCE TO RELATED APPLICATION

The present application is a continuation of International Application No. PCT/CN2021/122374, filed Sep. 30, 2021, which is incorporated herein by reference in its entirety.

TECHNICAL FIELD

The present application relates to the technical field of power electronics, and in particular to a method and apparatus for suppressing grid voltage imbalance.

BACKGROUND

In order to achieve normal operation of a three-phase active front-end rectifier in an imbalanced grid and to achieve an adjustable bus voltage, a unity power factor and a current total harmonic distortion (THD; which reflects the current quality of the grid, with a smaller THD indicating a higher current quality) that is less than 5%, in the prior art, proportional-integral controllers, repetition controllers, and resonance controllers are used to obtain an output voltage that acts on the three-phase active front-end rectifier.

Among them, the proportional-integral controller (PI) is used for tracking the fundamental current in the current and obtaining a first component of the output voltage; the repetition controller is used for tracking the six-fold frequency components in the current to suppress the (6n±1)th harmonic and obtaining a second component of the output voltage; the resonance controller is used for tracking the two-fold frequency components in the current to suppress the third harmonic and obtaining the third component of the output voltage; and the output voltage of the rectifier is the sum of the first component of the output voltage, the second component of the output voltage, and the third component of the output voltage.

Then, the purpose of simultaneously suppressing the (6n±1)th (e.g., fifth and seventh) harmonic caused by the grid voltage and the dead-time effect as well as the third harmonic caused by grid imbalance is achieved.

The prior art achieves the tracking of the 6-fold frequency components by the repetition controller, and this method is extremely sensitive to the frequency of the grid, and once the grid frequency fluctuates, the control performance will be greatly deteriorated; in addition, the repetition control also requires the development of a pair of arrays of 400 floating points (corresponding to 50 Hz grid, and 20 kHz control frequency), which consumes a great amount of memory.

SUMMARY OF THE DISCLOSURE

The objective of the embodiments of the present application is to provide a method and apparatus for suppressing grid voltage imbalance to solve the problem that the control performance deteriorates when the power grid frequency fluctuates because the control method in the prior art is sensitive to the power grid frequency.

An embodiments of the present application provides a method for suppressing grid voltage imbalance, wherein the method applies to a PWM rectifier, comprising:
acquiring a grid voltage and a grid current;
calculating, according to the grid voltage, a 90° lagged grid voltage by a differential tracker;
calculating instantaneous power according to the 90° lagged grid voltage and the grid current;
calculating a power converter voltage according to the instantaneous power; and
obtaining, according to the power converter voltage, a corresponding pulse sequence to suppress grid voltage imbalance.

In the above technical solution, by obtaining a 90° lagged grid voltage through a differential tracker, calculating instantaneous power using the 90° lagged grid voltage, and then calculating a power converter voltage according to the instantaneous power, the suppression of grid voltage imbalance is achieved. The function of the differential tracker is to extract differential information from noise-polluted signals, and because the differential of a trigonometric function is in direct proportion to the 90° lag thereof, the 90° lagged grid voltage can be calculated using the differential tracker, and because the use of arrays is eliminated, it is insensitive to grid frequency variations, and its control performance is not affected when the grid frequency fluctuates, and it saves a lot of memory resources.

In some optional implementations, acquiring a grid voltage and a grid current comprises:
acquiring a three-phase alternating current (AC) voltage and a three-phase AC current; and
performing a Clark transformation on the three-phase AC voltage and the three-phase AC current to obtain the grid voltage and the grid current in an orthogonal static coordinate system.

In some optional implementations, the instantaneous power comprises instantaneous active power and instantaneous reactive power.

In the above technical solution, the improved instantaneous power theory is adopted to calculate the instantaneous active power and the instantaneous reactive power using the 90° lagged grid voltage and the grid current, so as to realize the tracking of the instantaneous active power and the instantaneous reactive power under the imbalanced grid, which can more truly reflect the actual grid power situation and enhances the control of the instantaneous power, thereby leading to a higher suppression capability for the grid imbalance.

In some optional implementations, calculating a power converter voltage according to the instantaneous power comprises:
performing a Park transformation on the grid voltage in the orthogonal static coordinate system to obtain a d-axis grid voltage and a q-axis grid voltage in an orthogonal rotating coordinate system;
adding to the d-axis grid voltage a bias, which is obtained by seeking a difference between the instantaneous active power and an active power given and then inputting same to a proportional-integral controller and a resonance controller, to obtain a d-axis power converter voltage;
adding to the q-axis grid voltage a bias, which is obtained by seeking a difference between the instantaneous reactive power and a reactive power given and then inputting same to a proportional-integral controller and a resonance controller, to obtain a q-axis power converter voltage; and
performing an inverse Park transformation on the d-axis power converter voltage and the q-axis power converter voltage to obtain an α-axis power converter voltage and a β-axis power converter voltage.

In the above technical solution, the difference between the instantaneous reactive power and the reactive power given is sought and then input to the proportional-integral controller and the resonance controller, wherein the proportional-integral controller is used to eliminate the static difference of the control, and then the resonance controller is introduced to reconstruct the distorted grid components, so as to eliminate the current harmonics caused by the grid voltage harmonics in the case of grid imbalance.

In some optional implementations, obtaining, according to the power converter voltage, a corresponding pulse sequence to suppress grid voltage imbalance comprises:

obtaining the corresponding pulse sequence using a modulation strategy according to the α-axis power converter voltage and the β-axis power converter voltage; and inputting the pulse sequence to a power converter to suppress the grid voltage imbalance.

In some optional embodiments, the modulation strategy adopts pulse width modulation, space vector pulse width modulation or sinusoidal pulse width modulation.

An embodiment of the present application provides an apparatus for suppressing grid voltage imbalance, comprising:

an acquisition module for acquiring a grid voltage and a grid current;

a differential tracker for calculating, according to the grid voltage, a 90° lagged grid voltage by the differential tracker;

an instantaneous power calculation module for calculating instantaneous power according to the 90° lagged grid voltage and the grid current;

a power converter voltage calculation module for calculating a power converter voltage according to the instantaneous power; and a pulse sequence acquisition module for obtaining, according to the power converter voltage, a corresponding pulse sequence to suppress grid voltage imbalance.

The apparatus for suppressing grid voltage imbalance in the above technical solution comprises an acquisition module, a differential tracker, an instantaneous power calculation module, a power converter voltage calculation module and a pulse sequence acquisition module. The function of the differential tracker is to extract differential information from noise-polluted signals, and because the differential of a trigonometric function is in direct proportion to the 90° lag thereof, the 90° lagged grid voltage can be calculated using the differential tracker, and it is not necessary to develop a pair of arrays of 100 floating points in the micro-controller, so it is insensitive to grid frequency variations, and its control performance is not affected when the grid frequency fluctuates, and it saves a lot of memory resources.

In some optional implementations, the acquisition module is further used for acquiring a three-phase AC voltage and a three-phase AC current; and performing a Park transformation on the three-phase AC voltage and the three-phase AC current to obtain the grid voltage and the grid current in an orthogonal rotating coordinate system.

The instantaneous power calculation module is further used for calculating instantaneous active power and instantaneous reactive power according to the 90° lagged grid voltage and the grid current.

The instantaneous power calculation module in the above technical solution calculates the instantaneous active power and the instantaneous reactive power using the 90° lagged grid voltage and the grid current to realize the tracking of the instantaneous active power and the instantaneous reactive power under the imbalanced grid, which can more truly reflect the actual grid power situation and enhances the control of the instantaneous power, thereby leading to a higher suppression capability for the grid imbalance.

In some optional implementations, the power converter voltage calculation module is further used for:

performing a Park transformation on the grid voltage in the orthogonal static coordinate system to obtain a d-axis grid voltage and a q-axis grid voltage in an orthogonal rotating coordinate system; adding to the d-axis grid voltage a bias, which is obtained by seeking a difference between the instantaneous active power and an active power given and then inputting same to a proportional-integral controller and a resonance controller, to obtain a d-axis power converter voltage; adding to the q-axis grid voltage a bias, which is obtained by seeking a difference between the instantaneous reactive power and a reactive power given and then inputting same to a proportional-integral controller and a resonance controller, to obtain a q-axis power converter voltage; and performing an inverse Park transformation on the d-axis power converter voltage and the q-axis power converter voltage to obtain an α-axis power converter voltage and a β-axis power converter voltage.

The power converter voltage calculation module in the above technical solution seeks the difference between the instantaneous reactive power and the reactive power given and then inputs same to the proportional-integral controller and the resonance controller, wherein the proportional-integral controller is used to eliminate the static difference of the control, and then the resonance controller is introduced to reconstruct the distorted grid components, so as to eliminate the current harmonics caused by the grid voltage harmonics in the case of grid imbalance.

In some optional implementations, the pulse sequence acquisition module is further used for:

obtaining the corresponding pulse sequence using a modulation strategy according to the α-axis power converter voltage and the β-axis power converter voltage; and inputting the pulse sequence to a power converter to suppress the grid voltage imbalance.

An embodiment of the present application provides a computer-readable storage medium, wherein the storage medium has a computer program stored thereon, the computer program, when run by a processor, executing any of the above methods.

The above description is only a summary of the technical solutions of the present application. In order to be able to understand the technical means of the present application more clearly, the technical means can be implemented according to the content of the specification. Furthermore, to make the above and other objectives, features and advantages of the present application more comprehensible, specific implementations of the present application are exemplified below.

DESCRIPTION OF DRAWINGS

To more clearly describe the technical solutions of the embodiments of the present application, the drawings to be used in the embodiments of the present application will be briefly introduced below, and it should be understood that the following drawings only show some embodiments of the present application, and therefore should not be considered as limiting the scope of the present application. For those of ordinary skills in the art, other relevant drawings may also be obtained based on these drawings without creative efforts. In the accompanying drawings:

FIG. 1 is a flowchart of steps of a method for suppressing grid voltage imbalance as provided in embodiments of the present application;

FIG. 2 is a flowchart of specific steps for acquiring a grid voltage and a grid current as provided in embodiments of the present application;

Figure 3:
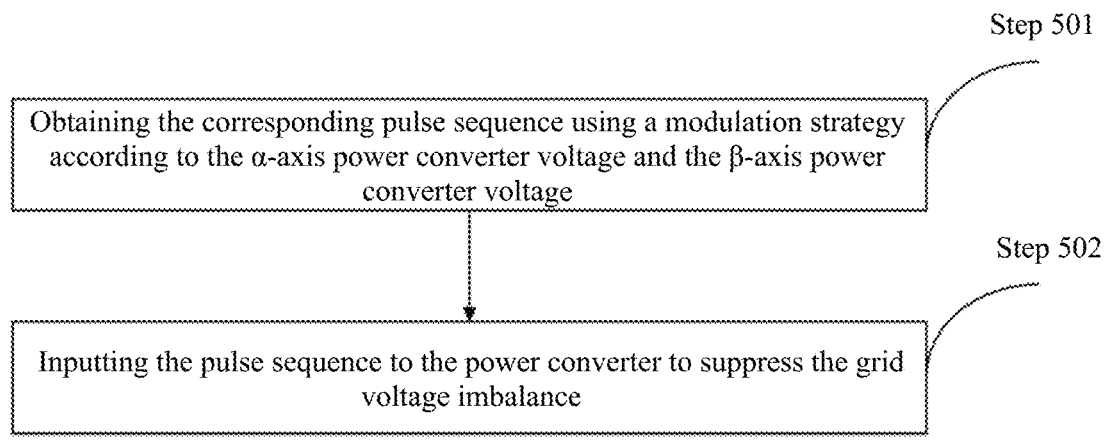
FIG. 3 is a flowchart of steps for suppressing grid voltage imbalance using a power converter voltage as provided in embodiments of the present application.

Reference numerals: 1—Acquisition module, 2—Differential tracker, 3—Instantaneous power calculation module, 4—Power converter voltage calculation module, 5—Pulse sequence acquisition module.

DETAILED DESCRIPTION

Examples of the technical solutions of the present application will be described in detail below in conjunction with the drawings. The following embodiments are only used to more clearly illustrate the technical solution of the present application, and therefore are only used as examples and cannot be used to limit the scope of protection of the present application.

Unless otherwise defined, all technical and scientific terms used herein have the same meaning as commonly understood by those skilled in the art belonging to the technical field of the present application; the terms used herein are intended only for the purpose of describing specific examples and are not intended to limit the present application; the terms "including" and "having" and any variations thereof in the specification and the claims of the present application and in the description of drawings above are intended to cover non-exclusive inclusion.

Reference herein to "an embodiment" means that a particular feature, structure, or characteristic described in connection with the embodiment can be included in at least one embodiment of the present application. The appearance of this phrase in various places in the specification does not necessarily refer to the same embodiment, nor is it a separate or alternative embodiment that is mutually exclusive with other embodiments. It is explicitly and implicitly understood by those skilled in the art that the embodiments described herein may be combined with other embodiments.

For AC charging piles, they often work in grid imbalanced areas, but the industry standards require normal operation within the range of 50 Hz+−5 Hz.

The applicant noticed that the prior art is sensitive to the fluctuations of grid frequency, and thus the charging piles are prone to failures, which even affect the stable operation of the grid in the area.

In order to avoid the failures of charging piles due to the sensitivity to fluctuations in the grid frequency, the applicant found that it is possible to calculate the instantaneous active power and the instantaneous reactive power in real time using the instantaneous power theory, and improve the conventional current inner loop into a power inner loop to directly track the instantaneous active power and the instantaneous reactive power. However, under the imbalanced grid, the conventional instantaneous power theory cannot calculate the reactive power accurately and the control of instantaneous power is greatly weakened. Therefore, the applicant adopts an improved instantaneous power theory that can achieve good tracking of reactive power under an imbalanced grid. However, since the improved instantaneous power calculation requires a 90° lagged voltage value, it is still necessary to develop a pair of arrays of 100 floating points, which is still a big challenge for the micro-controller.

Based on the above considerations, in an active front-end rectifier control algorithm, the applicant introduces a differential tracker to obtain the 90° lagged voltage by using the characteristic that the differential of a trigonometric function is in direct proportion to the 90° lag thereof, thus avoiding developing a pair of arrays of 100 floating points for the calculation and saving a lot of memory consumption, and, such a calculation approach becomes more insensitive to grid frequency variations, thus ensuring the normal operation of the active front-end rectifier under the conditions of grid imbalance and grid frequency variations.

For example, assuming that the grid frequency changes from the original mains frequency of 50 Hz to 45 Hz, the differential component obtained by using a differential tracker to calculate its differential will also change with the frequency, and then the accurate active power and reactive power will be calculated. If the array approach is used, 50 Hz corresponds to an array of 400 points (at a control frequency of 50 us), 55 Hz corresponds to 363 (363.63) array elements, and 45 Hz corresponds to 444 (444.44) array elements. If dynamic arrays are not used, it is difficult to achieve relatively accurate power calculation when the grid frequency variations, and because of the high embedded security requirements and the risk of memory overflow when using dynamic arrays, dynamic arrays cannot be used.

It should be clear that the following embodiments of the present application can be applied in the situation where the industry standard requires the grid frequency to be within the range of 50 Hz+−5 Hz, but are not limited to that situation, and can also be applied in other possible situations where the grid frequency fluctuates.

Referring to FIG. 1. FIG. 1 is a flowchart of steps of a method for suppressing grid voltage imbalance as provided in embodiments of the present application, wherein the method applies to a PWM rectifier, comprising:

Step 100: acquiring a grid voltage and a grid current;

The grid voltage and the grid current in step 100 are the grid voltage and the grid current in the orthogonal static coordinate system. It is possible to directly acquire the grid voltage and the grid current in the orthogonal static coordinate system, or to acquire the three-phase AC voltage and the three-phase AC current and then perform a Clark transformation thereon to obtain the grid voltage and the grid current in the orthogonal static coordinate system.

Step 200: calculating, according to the grid voltage, a 90° lagged grid voltage by a differential tracker;

The function of the differential tracker in step 200 is to extract differential information from noise-polluted signals, and to achieve the tracking of the grid voltage according to the direct proportion relationship between the differential of the trigonometric function and the 90° lag thereof to obtain the 90° lagged grid voltage.

Step 300: calculating instantaneous power according to the 90° lagged grid voltage and the grid current;

In step 300, when calculating the instantaneous power, it may be further classified into instantaneous active power and instantaneous reactive power, or may be not divided, which is not limited here, as long as the 90° lagged grid voltage and the grid current can be used to calculate the instantaneous power, and since the bus voltage is directly related to the power on the bus, a faster response can be obtained for the power inner loop than the current inner loop.

Step 400: calculating a power converter voltage according to the instantaneous power;

Step 500: obtaining, according to the power converter voltage, a corresponding pulse sequence to suppress grid voltage imbalance.

Among them, the PWM (Pulse Width Modulation) rectifier is an indispensable power electronic device in industrial applications, which is widely used in electric power, electronics, communications, transportation, health care and other fields; the differential tracker adopts the active disturbance rejection control technique (ADRC); the power converter voltage is the voltage obtained after the power converter transforms the grid voltage; the magnitude of the instantaneous power is equal to the product of instantaneous values of the instantaneous voltage and current; and the instantaneous active power is related to the energy of the load, and the instantaneous reactive power controls the unity power factor.

In the above technical solution, by obtaining a 90° lagged grid voltage through a differential tracker, calculating instantaneous power using the 90° lagged grid voltage, and then calculating a power converter voltage according to the instantaneous power, the suppression of grid voltage imbalance is achieved. Since the 90° lagged information with the three-phase AC grid voltage for a pair of arrays of 100 floating-point data is replaced with a differential tracker, the use of arrays is eliminated, so it is insensitive to grid frequency variations, and its control performance is not affected when the grid frequency fluctuates, and it saves a lot of memory resources.

In some optional implementations, please refer to FIG. 2. FIG. 2 is a flowchart of specific steps for acquiring a grid voltage and a grid current, that is, step 100 further comprises:

Step 101: acquiring a three-phase AC voltage and a three-phase AC current;

Step 102: performing a Clark transformation on the three-phase AC voltage and the three-phase AC current to obtain the grid voltage and the grid current in an orthogonal static coordinate system.

In the embodiments of the present application, the three-phase AC voltage and the three-phase AC current are directly collected from the bus, so the method of this embodiment can directly process the collected three-phase AC voltage and three-phase AC current.

In some optional implementations, further, the instantaneous power is classified into instantaneous active power and instantaneous reactive power; then step 300 comprises: calculating instantaneous active power and instantaneous reactive power according to the 90° lagged grid voltage and the grid current.

In the method for suppressing grid voltage imbalance of the embodiments of the present application, the improved instantaneous power theory is adopted to calculate the instantaneous active power and the instantaneous reactive power using the 90° lagged grid voltage and the grid current, so as to realize the tracking of the instantaneous active power and the instantaneous reactive power under the imbalanced grid, which can more truly reflect the actual grid power situation and enhances the control of the instantaneous power, thereby leading to a higher suppression capability for the grid imbalance.

In some optional implementations, in step 400, the calculation process for calculating a power converter voltage according to the instantaneous power specifically comprises:

performing a Park transformation on the grid voltage in the orthogonal static coordinate system to obtain a d-axis grid voltage and a q-axis grid voltage in an orthogonal rotating coordinate system; adding to the d-axis grid voltage a bias, which is obtained by seeking a difference between the instantaneous active power and an active power given and then inputting same to a proportional-integral controller and a resonance controller, to obtain a d-axis power converter voltage; adding to the q-axis grid voltage a bias, which is obtained by seeking a difference between the instantaneous reactive power and a reactive power given and then inputting same to a proportional-integral controller and a resonance controller, to obtain a q-axis power converter voltage; and performing an inverse Park transformation on the d-axis power converter voltage and the q-axis power converter voltage to obtain an α-axis power converter voltage and a β-axis power converter voltage. Among them, the reactive power given is the given value of the reactive power and the active power given is the given value of the active power; and in the proportional-integral controller, the integration action makes the output of the controller to be proportional to the integral of the deviation, so there is no residual difference at the end of the transition process. However, with the integration action, the stability is reduced, and the proportional band is increased during the integration action, which can maintain the stability, but lead to increases in the overshoot and the oscillation period, and increase in the transition time. This controller is the most applicable, and it is suitable for regulating a system for which the channel hysteresis is small, the load does not vary much, and the process requirements cannot have a residual difference; and the resonance controller is a circuit that is composed of inductors and capacitors and can resonate at one or several frequencies, collectively referred to as resonant circuits. When the reactive power given is 0, its interpolation is the opposite of the instantaneous reactive power, i.e., negative instantaneous reactive power. Generally, the grid-connected inverter operates in the unity power factor mode, in which mode the reactive power is 0, and at this time, the active power delivered to the grid is the most, and the losses are the least for the same active power. Depending on the situation, there are also cases where the reactive power is not 0. For example, the grid-connected inverter is required to provide a low-voltage ride-through function, and a certain amount of reactive power needs to be injected into the grid to maintain the stability of the grid voltage.

In the embodiments of the present application, the difference between the instantaneous reactive power and the reactive power given is sought and then input to the proportional-integral controller and the resonance controller, wherein the proportional-integral controller is used to eliminate the static difference of the control, and then the resonance controller is introduced to reconstruct the distorted grid components, so as to eliminate the current harmonics caused by the grid voltage harmonics in the case of grid imbalance. Moreover, the improved instantaneous power in the case of imbalance can better reflect the actual grid condition, so the distorted grid components reconstructed using the improved instantaneous power are more accurate than those reconstructed using the d-axis current and the q-axis current. For example, for an imbalanced three-phase grid at a grid frequency of 46 Hz, because an array of 400 floating-point elements for each of the α-axis current and the β-axis current are predetermined, the solution that uses the arrays to acquire a 90° lagged voltage will not be able to adapt to changes in the grid frequency, and its performance will be deteriorated dramatically. For example, suppose that the grid frequency has changed from the original mains frequency of 50 Hz to 45 Hz, if the array approach is adopted, 50 Hz corresponds to an array of 400 points (at a control frequency of 50 us), 55 Hz corresponds to 363 (363.63) array elements, and 45 Hz corresponds to 444 (444.44) array elements. That is, if an array of 400 points is used, it is impossible to store data (more than 400) of a complete cycle at 45 Hz, while the access algorithm is quite complicated at 55 Hz and there are some errors due to the existence of decimals.

This solution calculates the improved instantaneous power theory by obtaining the 90° lagged grid voltage through the differential tracker. In this process, the calculation of the differential controller is not related to the grid frequency and does not require the use of a large number of arrays. The calculation of the instantaneous power requires the use of a 90° lagged grid voltage. In the conventional method, it is obtained from the array, and method is also affected by the grid frequency, while in this solution, it is obtained using the differential controller, so this solution can operate stably under a grid having fluctuating frequencies and can effectively suppress the grid voltage harmonics.

In some optional implementations, please refer to FIG. 3. FIG. 3 is a flowchart of steps for suppressing grid voltage imbalance using a power converter voltage, that is, step 500 specifically comprises:

Step 501: obtaining the corresponding pulse sequence using a modulation strategy according to the α-axis power converter voltage and the β-axis power converter voltage;

Step 502: inputting the pulse sequence to the power converter to suppress the grid voltage imbalance.

In the embodiments of the present application, for the obtained power converter voltage, the corresponding pulse sequence is obtained using the modulation strategy, so that the power converter can suppress the grid voltage imbalance according to the pulse sequence.

In some optional implementations, the modulation strategy used in step 501 comprises pulse width modulation (PWM), sinusoidal pulse width modulation (SPWM), space vector pulse width modulation (SVPWM), and the like.

Figure 4:
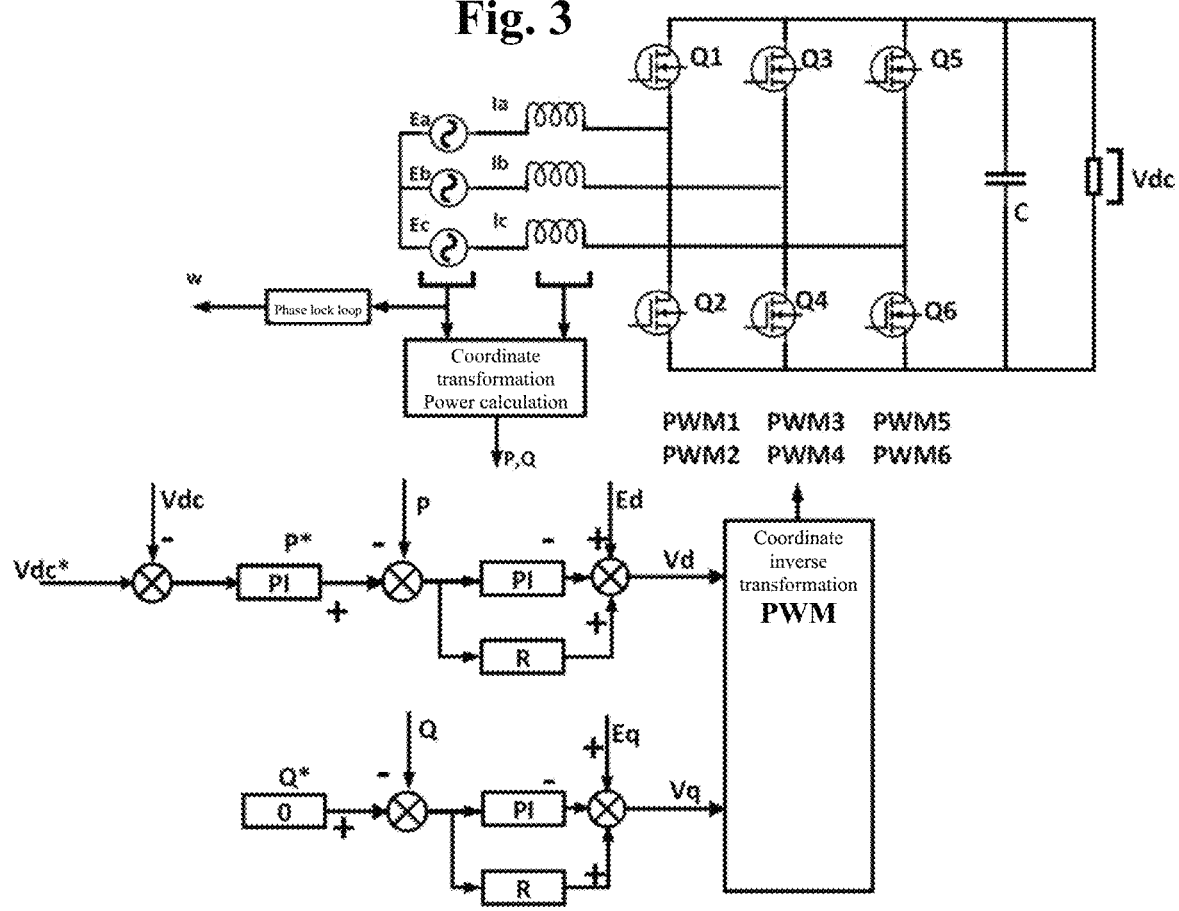
FIG. 4 is a diagram of functional modules of a PWM rectifier as provided in embodiments of the present application.

According to some embodiments of the present application, please refer to FIG. 4. FIG. 4 is a diagram of functional modules of a PWM rectifier. In FIG. 4, Ea, Eb, and Ec are samples of the three-phase grid voltages of a, b, and c, respectively, with the sampling points being located at the ends of the inductors close to the grid; Ia, Ib, and Ic are samples of the three-phase currents of a, b, and c, respectively, wherein what are sampled here are the currents flowing through the three-phase inductor; and Vdc is the sample of the bus voltage, wherein what is sampled here is the voltage on the output capacitor. Q1 to Q6 are switching diodes, and the pulse sequence obtained through the algorithm is applied to the switching diodes to control their on/off. Phase lock loop (PLL) calculates the frequency and phase of the grid, and the output w is the grid angular frequency. Coordinate transformations, namely the Park and Clark transformations, convert the three-phase static coordinate system into a two-phase static coordinate system and a two-phase rotating coordinate system. The power calculation uses the 90° lagged grid voltage and the real-time grid current. In the present application, the 90° lagged grid voltage is obtained by the differential tracker, and the results calculated by this module are the instantaneous active power and the instantaneous reactive power.

In conventional vector control, the outer loop is generally the output voltage loop, which controls the stability of the output voltage, while the inner loop is the current loop or power loop, which controls the stability of the inductor current or overall power. The embodiments of the present application seek improvement based on the power loop, where the instantaneous active power is related to the energy of the load, and the instantaneous reactive power controls the unity power factor. Coordinate inverse transformations are the inverse Park transformation and the inverse Clark transformation, and the PWM module may be SVPWM or SPWM or other PWM modulation approaches. PWM1 to PWM6 are outputs of the PWM modules, which control the on/off of Q1 to Q6 switching diodes, respectively.

Figure 5:
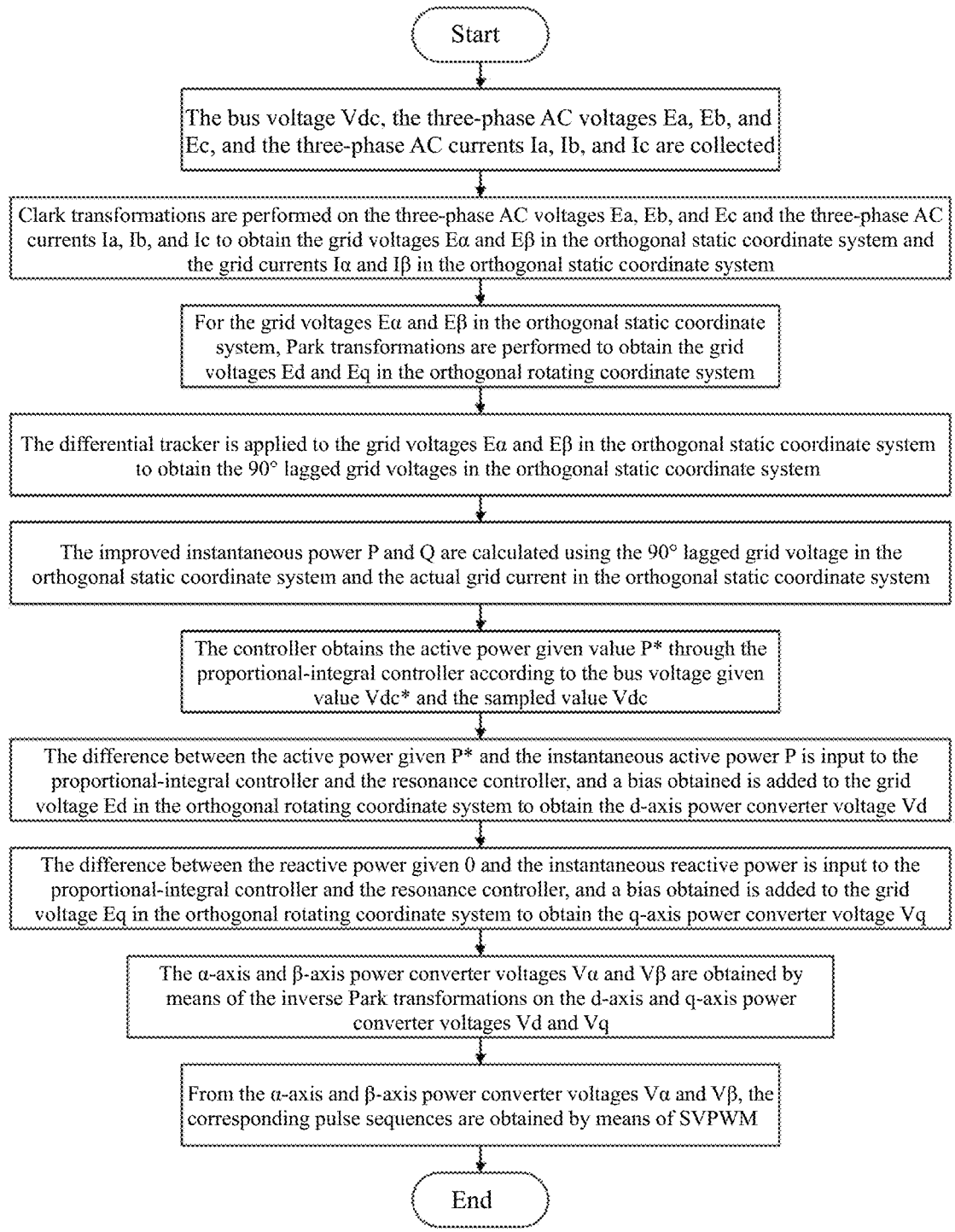
FIG. 5 is a working flowchart of a method for suppressing grid voltage imbalance as provided in embodiments of the present application.

Referring to FIG. 5. FIG. 5 is a working flowchart of a method for suppressing grid voltage imbalance, the specific steps comprising:

The bus voltage Vdc, the three-phase AC voltages Ea, Eb, and Ec, and the three-phase AC currents Ia, Ib, and Ic are collected.

Clark transformations are performed on the three-phase AC voltages Ea, Eb, and Ec and the three-phase AC currents Ia, Ib, and Ic to obtain the grid voltages Eα and Eβ in the orthogonal static coordinate system (i.e., the α-axis grid voltage Eα and the β-axis grid voltage Eβ) and the grid currents Iα and Iβ in the orthogonal static coordinate system (i.e., the α-axis grid current Iα and the β-axis grid current Iβ), as shown in the following equations:

$$\begin{pmatrix} E\alpha \\ E\beta \end{pmatrix} = \begin{pmatrix} 1 & -0.5 & -0.5 \\ 0 & \frac{\sqrt{3}}{2} & -\frac{\sqrt{3}}{2} \end{pmatrix} \cdot \begin{pmatrix} Ea \\ Eb \\ Ec \end{pmatrix}$$

$$\begin{pmatrix} I\alpha \\ I\beta \end{pmatrix} = \begin{pmatrix} 1 & -0.5 & -0.5 \\ 0 & \frac{\sqrt{3}}{2} & -\frac{\sqrt{3}}{2} \end{pmatrix} \cdot \begin{pmatrix} Ia \\ Ib \\ Ic \end{pmatrix}$$

For the grid voltages Eα and Eβ in the orthogonal static coordinate system, Park transformations are performed to obtain the grid voltages Ed and Eq in the orthogonal rotating coordinate system, i.e., the d-axis grid voltage Ed and the q-axis grid voltage Eq, as shown in the following equation:

$$\begin{pmatrix} Ed \\ Eq \end{pmatrix} = \begin{pmatrix} \cos(\theta) & \sin(\theta) \\ -\sin(\theta) & \cos(\theta) \end{pmatrix} \cdot \begin{pmatrix} E\alpha \\ E\beta \end{pmatrix}$$

The differential tracker is applied to the grid voltages Eα and Eβ in the orthogonal static coordinate system to obtain the 90° lagged grid voltages Eα' and Eβ' in the orthogonal static coordinate system. The calculation of the differential tracker is as shown in the following equations:

$x\alpha1(k)=x\alpha1(k-1)+h\cdot x\alpha2(k-1)$ $x\alpha2(k)=x\alpha2(k-1)-h\cdot r\hat{}2(x\alpha1(k-1)-E\alpha(k-1)+2/r\cdot x\alpha2(k-1))$ $x\beta1(k)=x\beta1(k-1)+h\cdot x\beta2(k-1)$ $x\beta2(k)=x\beta2(k-1)-h\cdot r\hat{}2(x\beta1(k-1)-E\beta(k-1)+2/r\cdot x\beta2(k-1))$ The 90° lagged voltage for Eα is Eα'=(Xα2(k))/w
The 90° lagged voltage for Eβ is Eβ'=(Xβ2(k))/w Here, r is the velocity tracking factor, the larger the value of r, the greater the tracking speed, his the filtering factor, the larger the value of h the smoother the waveform, xα1(k) is the tracking of Eα at the current k moment, xα2(k) is the tracking of the differential of Eα, xβ1(k) is the tracking of Eβ, xβ2(k) is the tracking of the differential of Eβ, xα1(k−1) is the tracking result for Eα at the k−1 moment, xα2(k−1) is the tracking result for the differential of Eα at the k−1 moment, xβ1(k−1) is the tracking result for Eα at the k−1 moment, and xβ2(k−1) is the tracking result for the differential of Eα at the k−1 moment; and w is the grid angular frequency, which is obtained by the phase lock loop (PLL).

The improved instantaneous power P and Q are calculated using the 90° lagged grid voltage in the orthogonal static coordinate system and the actual grid current in the orthogonal static coordinate system, as shown in the following equations:

The instantaneous active power $P=E\alpha' \cdot I\beta - E\beta' \cdot I\alpha$ The instantaneous reactive power $Q=E\alpha' \cdot I\alpha + E\beta' \cdot I\beta$ The controller obtains the active power given value P* through the proportional-integral controller according to the bus voltage given value Vdc* and the sampled value Vdc.

The difference between the active power given P* and the instantaneous active power P is input to the proportional-integral controller (PI in FIG. 4) and the resonance controller (R in FIG. 4), and the output of the proportional-integral controller is subtracted from the output of the resonance controller to obtain a bias, which is added to the grid voltage Ed in the orthogonal rotating coordinate system to obtain the d-axis power converter voltage Vd.

The difference between the reactive power given 0 and the instantaneous reactive power Q is input to the proportional-integral controller and the resonance controller, and the output of the proportional-integral controller is subtracted from the output of the resonance controller to obtain a bias, which is added to the grid voltage Eq in the orthogonal rotating coordinate system to obtain the q-axis power converter voltage Vq.

The transfer function of the proportional-integral controller is:

$$F(s) = Kp + \frac{Ki}{s}$$

The transfer function of the resonance controller is:

$$G(s) = \frac{Kr \cdot s}{s^2 + \omega c^2}$$

where Kp, Ki, Kr, ωc, and s are the proportional gain, integral gain, resonant gain, cutoff frequency and differential operator, respectively.

For the outer-loop proportional-integral controller, the input is the difference between the given voltage and the actual voltage, Vdc*−Vdc, and the output is the active power given P*; for the inner-loop proportional-integral controller and resonance controller for the active power, the input is the difference between the active power given and the calculated active power, P*−P, and the output is Vd'; and for the inner-loop proportional-integral controller and resonance controller for the reactive power, the input is the difference between the reactive power given and the calculated reactive power Q*−Q, and the output is Vq', then the converter voltages Vd and Vq are shown in the following equations:

$Vd=Ed-Vd'$ $Vq=Eq-Vq'$

The α-axis and β-axis power converter voltages Vα and Vβ are obtained by means of the inverse Park transformations on the d-axis and q-axis power converter voltages Vd and Vq, as shown in the following equation.

$$\begin{pmatrix} V\alpha \\ V\beta \end{pmatrix} = \begin{pmatrix} \cos(\theta) & -\sin(\theta) \\ \sin(\theta) & \cos(\theta) \end{pmatrix} \cdot \begin{pmatrix} Vd \\ Vq \end{pmatrix}$$

Finally, from the α-axis and β-axis power converter voltages Vα and Vβ, the corresponding pulse sequences are obtained by means of SVPWM.

In the above embodiment, the proportional-integral controller is used to eliminate the static difference of the control; moreover, the resonance controller is introduced to reconstruct the distorted grid components to eliminate the current harmonics caused by the grid voltage harmonics in the case of grid imbalance; the improved instantaneous power in the case of imbalance can better reflect the actual grid condition, so the reconstructed distorted grid components reconstructed using the improved instantaneous power are more accurate than those reconstructed using the d-axis current and the q-axis current; and in order to eliminate the need to use an array of 100 floating-point elements in the calculation of the improved instantaneous power, the differential tracker is introduced to obtain the 90° lagged grid voltage.

In summary, the advantages of one or more embodiments of the present application are as follows: 1. being insensitive to grid frequency variations and capable of operating normally in the 50 Hz+−5 Hz grid; 2. small memory consumption and no need to develop a pair of arrays of 400 floating-point elements to record the output of the repetition controller for a mains frequency period; and 3. better suppression effect for grid imbalance.

Figure 6:
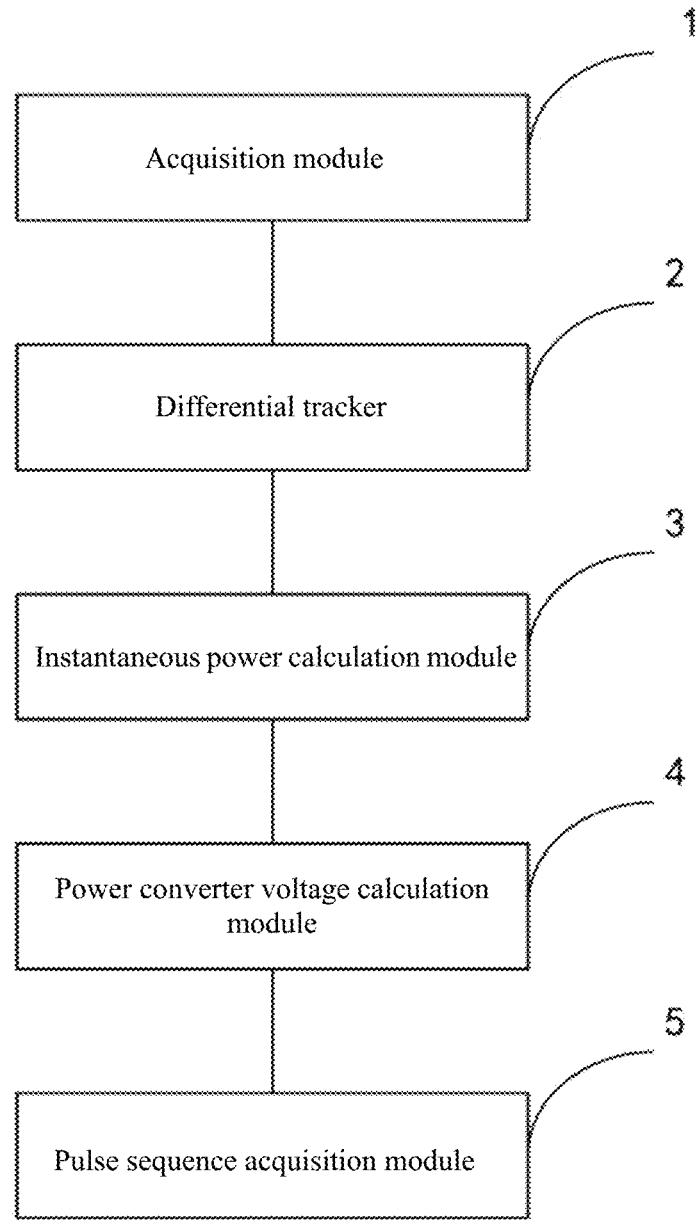
FIG. 6 is a diagram of functional modules of an apparatus for suppressing grid voltage imbalance as further provided in embodiments of the present application.

Referring to FIG. 6. FIG. 6 is a diagram of functional modules of an apparatus for suppressing grid voltage imbalance as further provided in embodiments of the present application, including: an acquisition module 1, a differential tracker 2, an instantaneous power calculation module 3, a power converter voltage calculation module 4, and a pulse sequence acquisition module 5. Among them, the acquisition module 1 is used for acquiring a grid voltage and a grid current; the differential tracker 2 is used for calculating, according to the grid voltage, a 90° lagged grid voltage by the differential tracker; the instantaneous power calculation module 3 is used for calculating instantaneous power according to the 90° lagged grid voltage and the grid current; the power converter voltage calculation module 4 is used for calculating a power converter voltage according to the instantaneous power; and the pulse sequence acquisition module 5 is used for obtaining, according to the power converter voltage, a corresponding pulse sequence to suppress grid voltage imbalance.

In the apparatus for suppressing grid voltage imbalance in the embodiments of the present application, the function of the differential tracker 2 is to extract differential information from noise-polluted signals, and because the differential of a trigonometric function is in direct proportion to the 90° lag thereof, so the 90° lagged grid voltage can be calculated using the differential tracker, and it is not necessary to develop a pair of arrays of 100 floating points in the micro-controller, so it is insensitive to grid frequency variations, and its control performance is not affected when the grid frequency fluctuates, and it saves a lot of memory resources.

In some optional implementations, the acquisition module 1 is further used for acquiring a three-phase AC voltage and a three-phase AC current; and performing a Park transformation on the three-phase AC voltage and the three-phase AC current to obtain the grid voltage and the grid current in an orthogonal rotating coordinate system; and the instantaneous power calculation module 3 is further used for calculating instantaneous active power and instantaneous reactive power according to the 90° lagged grid voltage and the grid current.

The instantaneous power calculation module 3 in the embodiments of the present application calculates the instantaneous active power and the instantaneous reactive power using the 90° lagged grid voltage and the grid current to realize the tracking of the instantaneous active power and the instantaneous reactive power under the imbalanced grid, which can more truly reflect the actual grid power situation and enhances the control of the instantaneous power, thereby leading to a higher suppression capability for the grid imbalance.

In some optional implementations, the power converter voltage calculation module 4 is further used for: performing a Park transformation on the grid voltage in the orthogonal static coordinate system to obtain a d-axis grid voltage and a q-axis grid voltage in an orthogonal rotating coordinate system; adding to the d-axis grid voltage a bias, which is obtained by seeking a difference between the instantaneous active power and an active power given and then inputting same to a proportional-integral controller and a resonance controller, to obtain a d-axis power converter voltage; adding to the q-axis grid voltage a bias, which is obtained by seeking a difference between the instantaneous reactive power and a reactive power given and then inputting same to a proportional-integral controller and a resonance controller, to obtain a q-axis power converter voltage; and performing an inverse Park transformation on the d-axis power converter voltage and the q-axis power converter voltage to obtain an α-axis power converter voltage and a β-axis power converter voltage.

In some optional implementation, the pulse sequence acquisition module 5 is further used for: obtaining the corresponding pulse sequence using a modulation strategy according to the α-axis power converter voltage and the β-axis power converter voltage; and inputting the pulse sequence to a power converter to suppress the grid voltage imbalance.

The embodiments of the present application further provide a computer-readable storage medium, wherein the computer-readable storage medium has computer program instructions stored thereon, the computer program instructions, when read and run by a processor of the computer, execute the method provided by the embodiments of the present application. For example, the computer-readable storage medium can implement: acquiring a grid voltage and a grid current; calculating, according to the grid voltage, a 90° lagged grid voltage by a differential tracker; calculating instantaneous power according to the 90° lagged voltage and the grid current; calculating a power converter voltage according to the instantaneous power; and obtaining, according to the power converter voltage, a corresponding pulse sequence to suppress grid voltage imbalance.

In the embodiments provided in the present application, it should be understood that the disclosed apparatus and method may be implemented in other manners. The apparatus embodiments described above are only illustrative. For example, the division of the units is only a logical function division. In an actual implementation, there may be other division approaches. For another example, a plurality of units or components may be combined or may be integrated into another system, or some features may be ignored, or not implemented. On the other hand, the shown or discussed mutual coupling or direct coupling or communication connection may be indirect coupling or communication connection through some communication interfaces, apparatuses, or units, and may be in electrical, mechanical, or in other forms.

In addition, the units described as separate components may or may not be physically separated, and components displayed as units may or may not be physical units, that is, may be located in one place, or may be distributed to a plurality of network units. Some or all of the units may be selected according to actual needs to achieve the purpose of the solution in this embodiment.

Furthermore, each functional module in each embodiment of the present application may be integrated together to form a separate part, or each module may exist separately, or two or more modules may be integrated to form a separate part.

Herein, relational terms such as "first", "second", etc., are used only to distinguish one entity or operation from another and do not necessarily require or imply any actual relationship or order between these entities or operations.

Described above are only the embodiments of the present application, and are not intended to limit the scope of protection of the present application, which can have various modifications and variations for those skilled in the art. Any modification, equivalent substitution, improvement, etc., made within the spirit and principles of the present application shall be included in the protection scope of the present application.

The invention claimed is:

1. A method applied to a pulse width modulation (PWM) rectifier, the method comprising:
    acquiring a grid voltage and a grid current;
    calculating, according to the grid voltage, a 90° lagged grid voltage by a differential tracker;
    calculating instantaneous power according to the 90° lagged grid voltage and the grid current;
    obtaining a first bias by obtaining a first difference between an instantaneous active power and an active power given and then inputting the first difference to a first proportional-integral controller and a first resonance controller;
    calculating a power converter voltage using the first bias and according to the instantaneous power; and
    obtaining, according to the power converter voltage, a corresponding pulse sequence to suppress grid voltage imbalance.

2. The method of claim 1, wherein the acquiring the grid voltage and the grid current comprises:
    acquiring a three-phase alternating current (AC) voltage and a three-phase AC current; and
    performing a Clark transformation on the three-phase AC voltage and the three-phase AC current to obtain the grid voltage and the grid current in an orthogonal static coordinate system.

3. The method of claim 2, wherein the instantaneous power comprises instantaneous active power and instantaneous reactive power.

4. The method of claim 3, wherein the calculating the power converter voltage according to the instantaneous power comprises:

performing a Park transformation on the grid voltage in the orthogonal static coordinate system to obtain a d-axis grid voltage and a q-axis grid voltage in an orthogonal rotating coordinate system;

adding the d-axis grid voltage to the first bias to obtain a d-axis power converter voltage;

adding the q-axis grid voltage to a second bias, which is obtained by obtaining a second difference between the instantaneous reactive power and a reactive power given and then inputting the second difference to a second proportional-integral controller and a second resonance controller, to obtain a q-axis power converter voltage; and performing an inverse Park transformation on the d-axis power converter voltage and the q-axis power converter voltage to obtain an α-axis power converter voltage and a β-axis power converter voltage.

5. The method of claim 4, wherein the obtaining, according to the power converter voltage, the corresponding pulse sequence to suppress the grid voltage imbalance comprises:

obtaining the corresponding pulse sequence using a modulation strategy according to the α-axis power converter voltage and the β-axis power converter voltage; and inputting the pulse sequence to a power converter to suppress the grid voltage imbalance.

6. The method of claim 5, wherein the modulation strategy adopts pulse width modulation, space vector pulse width modulation or sinusoidal pulse width modulation.

7. An apparatus, comprising:

an acquirer to acquire a grid voltage and a grid current;

a differential tracker to calculate, according to the grid voltage, a 90° lagged grid voltage by the differential tracker;

an instantaneous power calculation structure to:
  obtain a first bias by obtaining a first difference between an instantaneous active power and an active power given and then inputting the first difference to a first proportional-integral controller and a first resonance controller; and
  calculate instantaneous power using the first bias and according to the 90° lagged grid voltage and the grid current;

a power converter voltage calculation structure to calculate a power converter voltage according to the instantaneous power; and a pulse sequence acquisition structure to obtain, according to the power converter voltage, a corresponding pulse sequence to suppress grid voltage imbalance.

8. The apparatus of claim 7, wherein
the acquirer further
  acquires a three-phase alternating current (AC) voltage and a three-phase AC current; and
  performs a Park transformation on the three-phase AC voltage and the three-phase AC current to obtain the grid voltage and the grid current in an orthogonal rotating coordinate system; and the instantaneous power calculation structure further calculates the instantaneous active power and the instantaneous reactive power according to the 90° lagged grid voltage and the grid current.

9. The apparatus of claim 8, wherein the power converter voltage calculation structure further:

performs a Park transformation on the grid voltage in an orthogonal static coordinate system to obtain a d-axis grid voltage and a q-axis grid voltage in an orthogonal rotating coordinate system;

adds the d-axis grid voltage to the first bias, to obtain a d-axis power converter voltage;

adds the q-axis grid voltage to a second bias, which is obtained by obtaining a second difference between the instantaneous reactive power and a reactive power given and then inputting the second difference to a second proportional-integral controller and a second resonance controller, to obtain a q-axis power converter voltage; and performs an inverse Park transformation on the d-axis power converter voltage and the q-axis power converter voltage to obtain an α-axis power converter voltage and a β-axis power converter voltage.

10. The apparatus of claim 9, wherein the pulse sequence acquisition structure further:

obtains the corresponding pulse sequence using a modulation strategy according to the α-axis power converter voltage and the β-axis power converter voltage; and inputs the pulse sequence to a power converter to suppress the grid voltage imbalance.

11. A non-transitory computer-readable storage medium, wherein the storage medium has a computer program stored thereon, the computer program, when run by a processor, executing the method of claim 1.

12. The method of claim 1, further comprising:

obtaining a second bias by obtaining a second difference between an instantaneous reactive power and a reactive power given and then inputting the second difference to a second proportional-integral controller and a second resonance controller, wherein the calculating the power converter voltage uses the first bias and the second bias.

13. The apparatus of claim 7, wherein
the instantaneous power calculation structure further obtains a second bias by obtaining a second difference between an instantaneous reactive power and a reactive power given and then inputting the second difference to a second proportional-integral controller and a second resonance controller, and the instantaneous power calculation structure calculates the instantaneous power using the first bias and the second bias.

* * * * *